(12) United States Patent
Huang et al.

(10) Patent No.: US 11,398,530 B2
(45) Date of Patent: Jul. 26, 2022

(54) DISPLAY PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yongchao Huang, Beijing (CN); Jun Cheng, Beijing (CN); Jun Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 159 days.

(21) Appl. No.: 16/643,371

(22) PCT Filed: May 5, 2019

(86) PCT No.: PCT/CN2019/085547
§ 371 (c)(1),
(2) Date: Feb. 28, 2020

(87) PCT Pub. No.: WO2019/214549
PCT Pub. Date: Nov. 14, 2019

(65) Prior Publication Data
US 2021/0066398 A1 Mar. 4, 2021

(30) Foreign Application Priority Data
May 7, 2018 (CN) .......................... 201810427131.6

(51) Int. Cl.
H01L 27/32 (2006.01)

(52) U.S. Cl.
CPC ........ H01L 27/322 (2013.01); H01L 27/3276 (2013.01)

(58) Field of Classification Search
CPC H01L 27/322; H01L 27/3276; H01L 27/3213
See application file for complete search history.

(56) References Cited

U.S. PATENT DOCUMENTS

2007/0165158 A1 7/2007 Rho
2011/0025199 A1* 2/2011 Park ..................... H01L 51/5284
313/504

(Continued)

FOREIGN PATENT DOCUMENTS

CN 101132020 A 2/2008
CN 104835830 A 8/2015

(Continued)

OTHER PUBLICATIONS

First Office Action issued in corresponding Chinese Application No. 201810427131.6, dated Mar. 24, 2020, with English language translation.

Primary Examiner — Vongsavanh Sengdara
(74) Attorney, Agent, or Firm — McDermott Will & Emery LLP

(57) ABSTRACT

A display panel has pixel regions each includes sub-pixel regions, one of the sub-pixel regions is a white sub-pixel region, and remaining sub-pixel regions are color sub-pixel regions. The display panel includes signal lines and at least one filter group. The signal lines include two signal lines, a portion of each of the two signal lines is disposed between one white sub-pixel region and an adjacent color sub-pixel region, and there is a space between the two signal lines. Each filter group includes a first filter block and a second filter block, and a light transmission wavelength range of the first filter block does not overlap with that of the second filter block. An overlapping portion of the first filter block and the (Continued)

second filter block that are in one filter group covers a portion of the space disposed between the white sub-pixel region and the adjacent color sub-pixel region.

17 Claims, 2 Drawing Sheets

(56) References Cited

U.S. PATENT DOCUMENTS

| | | | |
|---|---|---|---|
| 2012/0217515 A1 | 8/2012 | Yamazaki et al. | |
| 2013/0113843 A1 | 5/2013 | Yamazaki | |
| 2013/0141481 A1* | 6/2013 | Peng | G09G 3/3607 345/694 |
| 2013/0250204 A1 | 9/2013 | Seki et al. | |
| 2015/0228214 A1* | 8/2015 | Liao | G09G 3/2003 345/84 |
| 2017/0110522 A1* | 4/2017 | Lee | H01L 27/3276 |
| 2017/0254935 A1 | 9/2017 | Shinsuke | |
| 2017/0256752 A1 | 9/2017 | Gee et al. | |
| 2017/0278894 A1 | 9/2017 | Sato et al. | |

FOREIGN PATENT DOCUMENTS

| | | |
|---|---|---|
| CN | 105514145 A | 4/2016 |
| CN | 205679893 U | 11/2016 |
| CN | 106601769 A | 4/2017 |
| CN | 106796948 A | 5/2017 |
| CN | 107079559 A | 8/2017 |
| CN | 107300801 A | 10/2017 |
| CN | 107452776 A | 12/2017 |
| CN | 108630733 A | 10/2018 |

* cited by examiner

DISPLAY PANEL

CROSS-REFERENCE TO RELATED APPLICATIONS

This application is a national phase entry under 35 USC 371 of International Patent Application No. PCT/CN2019/085547 filed on May 5, 2019, which claims priority and benefits to Chinese Patent Application No. 201810427131.6, filed with the Chinese Patent Office on May 7, 2018, titled "A DISPLAY PANEL", which are incorporated herein by reference in their entirety.

TECHNICAL FIELD

The present disclosure relates to the field of display technologies, and in particular, to a display panel.

BACKGROUND

A full color display of organic light-emitting diode (OLED) displays may be achieved by superimposing white organic light-emitting diodes (WOLEDs) and color filter layers (CFs).

SUMMARY

Embodiments of the present disclosure provide a display panel. The display panel has a plurality of pixel regions arranged in an array. Each pixel region includes a plurality of sub-pixel regions, one of the plurality of sub-pixel regions is a white sub-pixel region, and remaining sub-pixel regions are color sub-pixel regions. The display panel includes: a plurality of signal lines, wherein the plurality of signal lines include two signal lines that are adjacent to each other, a portion of each of the two signal lines is disposed between one white sub-pixel region and an adjacent color sub-pixel region, and there is a space between the two signal lines; and at least one filter group, wherein each filter group includes a first filter block and a second filter block that are disposed in a stack, and a light transmission wavelength range of the first filter block does not overlap with a light transmission wavelength range of the second filter block. An overlapping portion of the first filter block and the second filter block that are in one filter group covers a portion of the space disposed between the white sub-pixel region and the adjacent color sub-pixel region.

In some embodiments, the display panel further includes a plurality of color filter films, at least one portion of each color filter film being disposed in a corresponding color sub-pixel region. In the filter group, a material of one of the first filter block and the second filter block is the same as a material of an adjacent color filter film.

In some embodiments, a material of the first filter block in the filter group is the same as a material of an adjacent color filter film, and the first filter block is connected to the adjacent color filter film. The color filter film includes a portion connected to the first filter block, and the portion covers a portion of one signal line proximate to the color filter film in the two signal lines; or the first filter block includes a portion connected to the color filter film, and the portion covers a portion of one signal line proximate to the color filter film in the two signal lines.

In some embodiments, in each pixel region, the remaining sub-pixel regions include a first color sub-pixel region, a second color sub-pixel region, and a third color sub-pixel region. The display panel further includes: a plurality of first color filter films, at least one portion of each first color filter film being disposed in a corresponding first color sub-pixel region, a plurality of second color filter films, at least one portion of each second color filter film being disposed in a corresponding second color sub-pixel region, and a plurality of third color filter film, at least one portion of each third color filter film being disposed in a corresponding third color sub-pixel region. Colors of each first color filter film, each second color filter film, and each third color filter film are different from each other.

In some embodiments, a material of the first filter block is the same as a material of any one of each first color filter film, each second color filter film, and each third color filter film. A material of the second filter block is the same as a material of any one of each first color filter film, each second color filter film, and each third color filter film, and the material of the second filter block is different from the material of the first filter block in a same filter group.

In some embodiments, a color sub-pixel region adjacent to each white sub-pixel region is a third color sub-pixel region. A material of the first filter block in the filter group is the same as a material of an adjacent third color filter film.

In some embodiments, the first filter block is connected to the adjacent third color filter film. The third color filter film includes a portion connected to the first filter block, and the portion covers a portion of one signal line proximate to the third color sub-pixel region in the two signal lines; or the first filter block includes a portion connected to the third color filter film, and the portion covers a portion of one signal line proximate to the third color sub-pixel region in the two signal lines.

In some embodiments, a portion of the second filter block in the filter group covers a portion of one signal line proximate to the white sub-pixel region in the two signal lines.

In some embodiments, the display panel further includes: a substrate, wherein the plurality of signal lines and the at least one filter group are disposed on the substrate, and the second filter block in each filter group is disposed on a side of the first filter block in a same filter group away from the substrate; and a transparent insulating layer at least covering each second filter block.

In some embodiments, the display panel further includes: a plurality of white organic light-emitting diodes disposed on a side of the transparent insulating layer away from the substrate, each white organic light-emitting diode is disposed in a corresponding sub-pixel region. A light emission direction of each white organic light-emitting diode is directed toward the substrate, and light-emitting layers of two adjacent white organic light-emitting diodes are connected.

In some embodiments, in a row direction or a column direction in which the plurality of pixel regions are arranged, sub-pixel regions in each pixel region are arranged in an order of the first color sub-pixel region, the second color sub-pixel region, the white sub-pixel region, and the third color sub-pixel region.

In some embodiments, the first color filter film includes a red filter film, the second color filter film includes a green filter film, and the third color filter film includes a blue filter film.

In some embodiments, the plurality of signal lines include a plurality of data lines.

In some embodiments, the plurality of signal lines include a plurality of gate lines.

In some embodiments, the display panel further includes a common power line partially disposed between the white sub-pixel region and another adjacent color sub-pixel region.

In some embodiments, a color sub-pixel region adjacent to each white sub-pixel region is a third color sub-pixel region; and the plurality of signal lines further include another two signal lines that are adjacent to each other, a portion of each of the two signal lines is disposed between one first color sub-pixel region and an adjacent second color sub-pixel region, and there is a space between the two signal lines. One first color filter film disposed in the first color sub-pixel region covers a portion of one signal line proximate to the first color sub-pixel region in the two signal lines, and extends to the other signal line in the two signal lines. One second color filter film disposed in the second color sub-pixel region covers a portion of one signal line proximate to the second color sub-pixel region in the two signal lines, and extends to the other signal line in the two signal lines.

In some embodiments, the first filter block and the adjacent color filter film are connected to each other so as to form a whole structure.

In some embodiments, the first filter block and the adjacent third color filter film are connected to each other so as to form a whole structure.

In some embodiments, the display panel further includes a driving transistor electrically connected to each white organic light-emitting diode.

BRIEF DESCRIPTION OF THE DRAWINGS

In order to illustrate the technical solutions in embodiments of the present disclosure more clearly, the accompanying drawings used in the description of the embodiments of the present disclosure will be briefly introduced below. Obviously, the accompanying drawings to be described below are merely some embodiments of the present disclosure, and other drawings can be obtained by a person of ordinary skill in the art according to these drawings.

DETAILED DESCRIPTION

The technical solutions in embodiments of the present disclosure will be described clearly and completely with reference to the accompanying drawings in the embodiments of the present disclosure. Obviously, the described embodiments are merely some but not all of the embodiments of the present disclosure. All other embodiments obtained on the basis of the embodiments of the present disclosure by a person of ordinary skill in the art without paying any creative effort shall be included in the protection scope of the present disclosure.

In the following, the terms "first" and "second" are only used for descriptive purposes, and cannot be understood as indicating or implying relative importance or implicitly indicating the number of technical features indicated. Therefore, features defined as "first" and "second" may explicitly or implicitly include one or more of the features. In the description of some embodiments of the present disclosure, unless otherwise stated, "a plurality of" means two or more. Orientations or positional relationships indicated by terms "upper/above", "lower/below", etc. are based on orientations or positional relationships shown in the accompanying drawings, and are used merely for convenience of simplifying the description of the technical solutions in some embodiments of the present disclosure, and do not indicate or imply that the devices or elements must have a particular orientation, or must be constructed or operated in a particular orientation. Therefore, the orientations or positional relationships should not be construed as limitations to the present disclosure.

In a full-color OLED display, an OLED display panel generally includes a plurality of pixels arranged in an array. Each pixel includes a red sub-pixel R, a green sub-pixel G, a blue sub-pixel B and a white sub-pixel W.

In some examples, the red sub-pixel R, the green sub-pixel G, and the blue sub-pixel B included in each pixel are respectively formed by superimposing a WOLED and a filter layer with a corresponding color, and the white sub-pixel W is formed by superimposing a WOLED and a transparent insulating layer. Light-emitting layers of the WOLEDs in the sub-pixels are connected to each other so as to from a whole layer, which may facilitate the manufacturing of an OLED display panel. However, two signal lines (e.g., source drain (SD) lines) are generally disposed between each white sub-pixel W and one adjacent color sub-pixel (e.g., a red sub-pixel R). Although a diameter of each signal line is very small, and a space between the two signal lines is also small, light leakage is easily generated at the space between the two signal lines due to white light emitted by a portion of a light-emitting layer corresponding to the space. Therefore, a color deviation problem occurs in the OLED display panel, which may affect a display effect of the OLED display.

Figure 1:
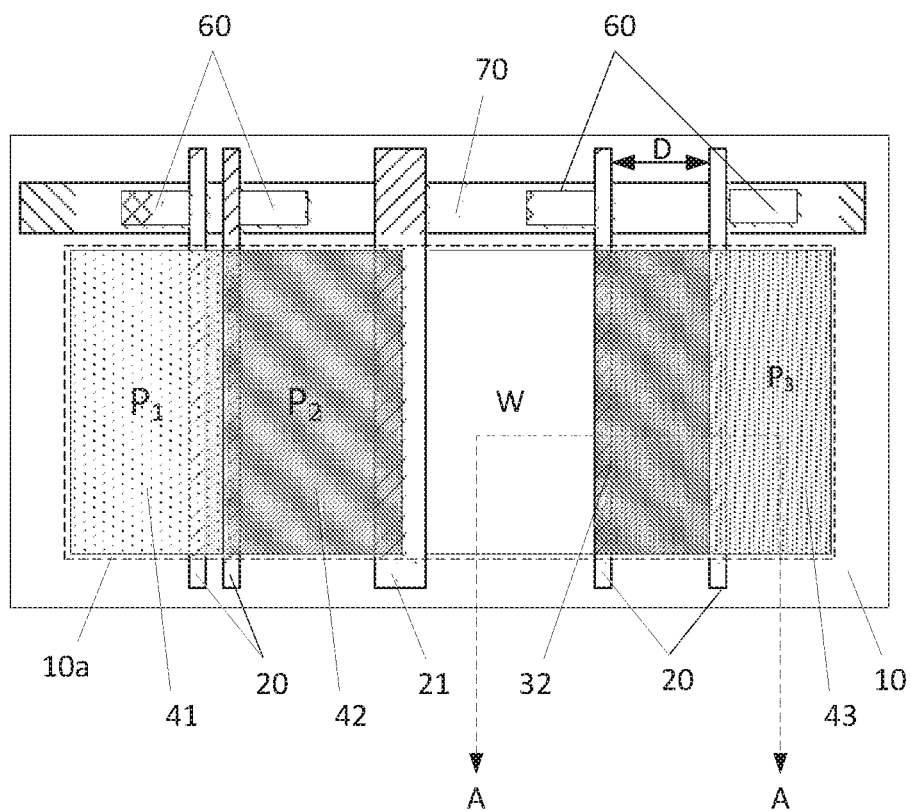
FIG. 1 is a schematic structural diagram of a display panel, according to some embodiments of the present disclosure.

Based on this, referring to FIGS. 1 to 4, some embodiments of the present disclosure provide a display panel 100. The display panel 100 has a plurality of pixel regions 10a arranged in an array. Each pixel region 10a includes a plurality of sub-pixel regions. One of the plurality of sub-pixel regions is a white sub-pixel region W (as shown in FIG. 1), and remaining sub-pixel regions are color sub-pixel regions (e.g., $P_1$, $P_2$, and $P_3$ shown in FIG. 1). The display panel 100 includes a plurality of signal lines 20, and the plurality of signal lines 20 includes two signal lines 20 that are adjacent to each other, a portion of each of the two signal lines 20 is disposed between one white sub-pixel region W and an adjacent color sub-pixel region (e.g., $P_3$), and there is a space D between the two signal lines 20. The display panel 100 further includes at least one filter group 3, each filter group 3 includes a first filter block 31 and a second filter block 32 disposed in a stack, and a light transmission wavelength range of the first filter block 31 does not overlap with a light transmission wavelength range of the second filter block 32. An overlapping portion 30 of the first filter block 31 and the second filter block 32 that are in one filter group 3 covers a portion of the space D disposed between the white sub-pixel region W and the adjacent color sub-pixel region $P_3$.

Herein, a pixel region is a spatial region defined by a boundary of a corresponding pixel, and a sub-pixel region is a spatial region defined by a boundary of a corresponding sub-pixel. The light transmission wavelength range of the first filter block 31 is a wavelength range of light that the first filter block 31 allows to transmit, and the light transmission wavelength range of the second filter block 32 is a wavelength range of light that the second filter block 32 allows to transmit. In addition, light transmission wavelength ranges of both the first filter block 31 and the second filter block 32 depend on colors of the first filter block 31 and the second filter block 32, respectively. For example, a color of the first filter block 31 is blue, and then the light transmission wavelength range thereof is a blue light wavelength range; a color of the second filter block 32 is red, and then the light transmission wavelength range thereof is a red light wavelength range. Some embodiments of the present disclosure do not limit the colors of the first filter block 31 and the second filter block 32, as long as the light transmission wavelength range of the first filter block 31 does not overlap with the light transmission wavelength range of the second filter block 32, so that white light cannot be transmitted through the overlapping portion of the first filter block 31 and the second filter block 32.

Figure 2:
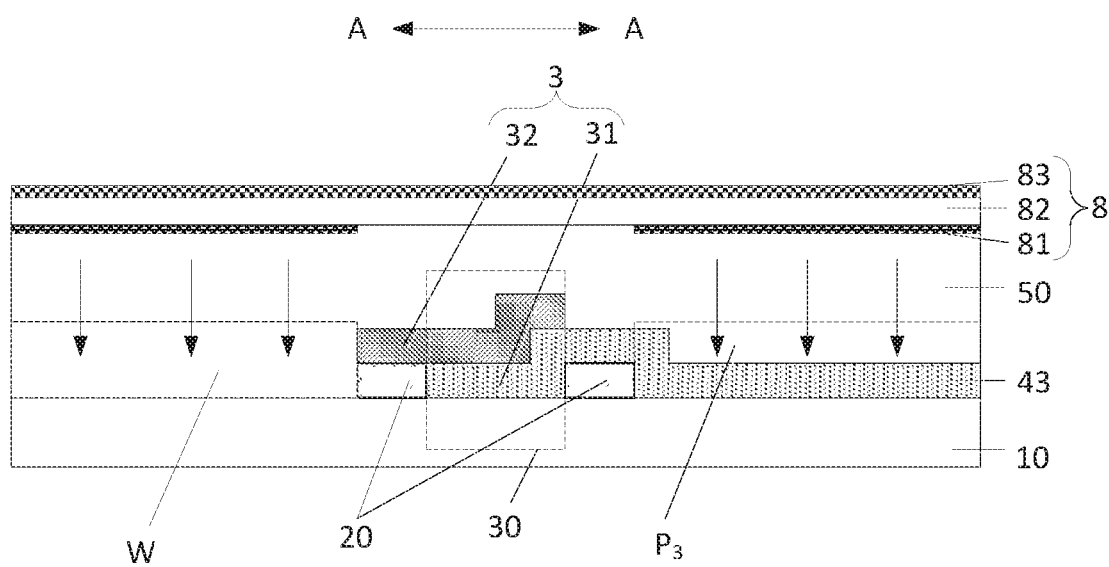
FIG. 2 is a schematic structural diagram of a cross-section of the display panel in the direction of A-A in FIG. 1.
Figure 4:
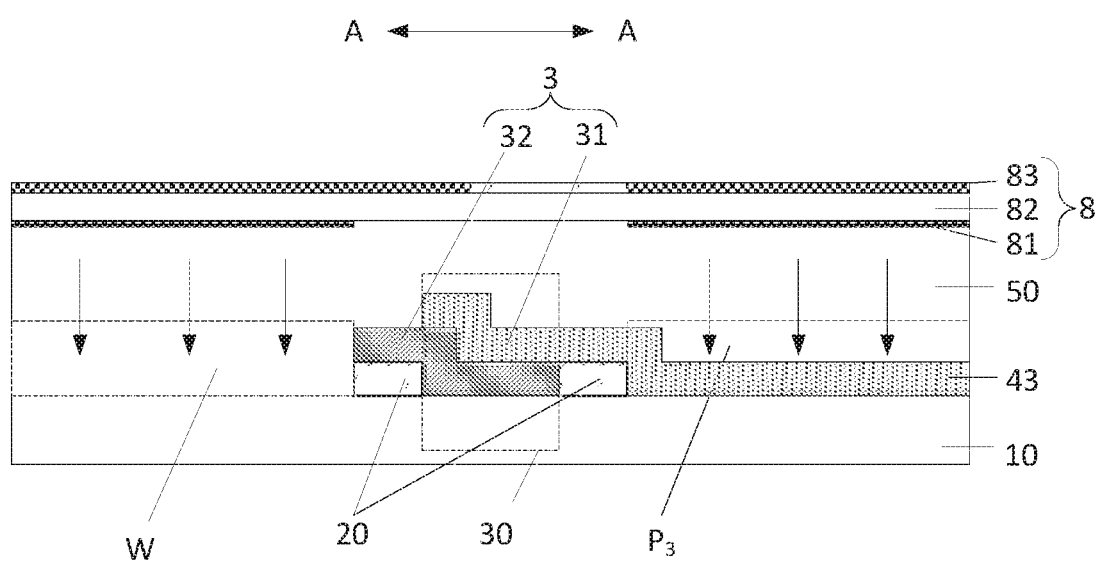
FIG. 4 is a schematic structural diagram of a cross-section of the display panel in the direction of A-A in FIG. 3.

Referring to FIGS. 1 and 2, the display panel 100 further includes a substrate 10 provided with a plurality of signal lines 20 and the at least one filter group 3. The first filter block 31 and the second filter block 32 in each filter group 3 are disposed in a stack. That is, as shown in FIG. 4, the second filter block 32 is disposed on a surface of the substrate 10, and the first filter block 31 is disposed on a side of the second filter block 32 away from the substrate 10; or as shown in FIG. 2, the first filter block 31 is disposed on a surface of the substrate 10, and the second filter block 32 is disposed on a side of the first filter block 31 away from the substrate 10.

In some examples, as shown in FIG. 1, the second filter block 32 in each filter group 3 is disposed on a side of the first filter block 31 away from the substrate 10. In this case, in the display panel 100, the second filter block 32 is disposed on a side of the first filter block 31 away from the substrate 10, that is, the first filter block 31 is blocked by the second filter block 32, so the reference numeral "31" of the first filter block 31 is not shown in FIG. 1.

The display panel 100 further includes a transparent insulating layer 50 at least covering each second filter block 32. Herein, the transparent insulating layer 50 at least covers each second filter block 32, which means that the transparent insulating layer 50 includes a portion covering each second filter block 32 and a portion disposed in other regions outside each second filter block 32. The other regions include, for example, at least one white sub-pixel region W or at least one color sub-pixel region adjacent to the at least one white sub-pixel region W.

With continued reference to FIGS. 1 and 2, the display panel 100 further includes a plurality of white organic light-emitting diodes 8 disposed on a side of the transparent insulating layer 50 away from the substrate 10, and each white organic light-emitting diode 8 is disposed in a corresponding sub-pixel region. A light emission direction of each white organic light-emitting diode 8 is directed toward the substrate 10 (a direction as indicated by the arrows in FIGS. 2 and 4). Herein, a white organic light-emitting diode 8 generally includes a transparent anode 81, a light-emitting layer 82 and a reflective cathode 83, which are sequentially disposed away from the substrate 10.

In some examples, light-emitting layers 82 of every two adjacent white organic light-emitting diodes 8 are connected, that is, light-emitting layers 82 of the white organic light-emitting diodes 8 are manufactured as a whole layer, which is conducive to simplifying a manufacturing process of the display panel 100.

With continued reference to FIGS. 1 and 2, the display panel 100 further includes a plurality of driving transistors 60, and each white organic light-emitting diode 8 is connected to one of the driving transistors 60. The driving transistors 60 are configured to drive corresponding white organic light-emitting diodes 8 to emit light. Herein, the driving transistors 60 include thin film transistors (TFTs), that is, the display panel 100 is an active-matrix organic light-emitting diode (AMOLED) display panel.

In some examples, an output terminal of each driving transistor 60 is generally connected to an anode of a corresponding white organic light-emitting diode 8, and the driving transistors 60 are disposed on a side of the transparent insulating layer 50 proximate to the substrate 10. Some embodiments of the present disclosure do not limit positions of the driving transistors 60. For example, it is also permissible that the driving transistors 60 are disposed on a side of the transparent insulating layer 50 facing away from the substrate 10.

In addition, the plurality of pixel regions 10a in the display panel 100 are arranged in an array, and a pixel corresponding to each pixel region 10a needs to be driven through at least one data line and at least one gate line to display image. For example, a gate of each driving transistor 60 is connected to one gate line, and a source of each driving transistor 60 is connected to one data line. Of course, it is permissible that gates of different driving transistors 60 are connected to a same gate line, or gates of different driving transistors 60 are connected to different gate lines. Similarly, it is also permissible that sources of different driving transistors 60 are connected to a same data line, or sources of different driving transistors 60 are connected to different data lines.

In some examples, referring to FIG. 1, the signal lines 20 are data lines, and the display panel 100 further includes a plurality of gate lines 70. Orthographic projections of the driving transistors 60 on the substrate 10 are located within orthographic projections of the gate lines 70 correspondingly connected to the driving transistors 60 on the substrate 10. In this way, it is conducive to improving aperture ratios of the sub-pixel regions, that is, aperture ratios of the pixels, thereby improving a light emission rate of the display panel 100. In some other examples, with continued reference to FIG. 1, the signal lines 20 are gate lines, and the display panel 100 further includes a plurality of data lines 70. It will be seen that the signal lines 20 in the above embodiments are either gate lines or data lines.

In each pixel region 10a, in a case where white light emitted by the light-emitting layer 82 enters the space D between every two signal lines 20 in the pixel region 10a, the white light firstly enters a corresponding filter group 3, so that the white light may be filtered by the first filter block 31 and the second filter block 32 in the filter group 3 respectively. In each filter group 3, the light transmission wavelength range of the first filter block 31 does not overlap with the light transmission wavelength range of the second filter block 32, that is, the light that the first filter block 31 allows to transmit cannot be transmitted through the second filter block 32, or the light that the second filter block 32 allows to transmit cannot be transmitted through the first filter block 31. Therefore, the white light can be prevented from being emitted from the space D between every two signal lines 20 in the pixel region 10a by utilizing each filter group 3, thereby avoiding light leakage at the space D between every two signal lines 20 in the pixel region 10a, and further avoiding the color deviation problem of the display panel 100. In this way, a display effect of the display panel 100 may be improved.

In some embodiments, the remaining sub-pixel regions other than the white sub-pixel region W in each pixel region 10a include at least one color sub-pixel region configured to display at least one color. The display panel 100 further includes a plurality of color filter films, and at least one portion of each color filter film is disposed in a corresponding color sub-pixel region. In each filter group 3, a material of one of the first filter block 31 and the second filter block 32 is the same as a material of one adjacent color filter film. In this way, in a process of manufacturing each filter group 3, the first filter block 31 or the second filter block 32 that is made of a same material as one adjacent color filter film, may be formed with the color filter film through a same patterning process, so as to reduce steps of manufacturing the filter groups 3, thereby improving the production efficiency of the display panel 100. Herein, a patterning process is a process of processing any film layer (one or more films) to form a film layer having a specific pattern, for example, the patterning process includes a mask process.

In some examples, a material of each first filter block 31 is the same as a material of one adjacent color filter film, and each first filter block 31 is connected to the adjacent color filter film. For example, a portion of the color filter film configured to be connected to the first filter block 31 covers a portion of one signal line 20 proximate to the color filter film in two corresponding signal lines 20; or a portion of the first filter block 31 configured to be connected to the color filter film covers a portion of one signal line 20 proximate to the color filter film in two corresponding signal lines 20. In this way, each first filter block 31 and the adjacent color filter film may be formed through a same patterning process, and a complexity of patterning design may also be reduced in a process of patterning formation of each first filter block 31 and each color filter film. Thereby, the design and manufacture of a corresponding mask plate and the manufacture of the display panel are simplified, which is conducive to improving the production efficiency of the display panel.

For example, as shown in FIG. 1, the remaining sub-pixel regions other than the white sub-pixel region W in each pixel region 10a include a first color sub-pixel region $P_1$, a second color sub-pixel region $P_2$ and a third color sub-pixel region $P_3$. The display panel further includes a plurality of first color filter films 41, at least one portion of each first color filter film 41 being disposed in a corresponding first color sub-pixel region $P_1$, a plurality of second color filter films 42, at least one portion of each second color filter film 42 being disposed in a corresponding second color sub-pixel region $P_2$, and a plurality of third color filter films 43, at least one portion of each third color filter film 43 being disposed in a corresponding third color sub-pixel region $P_3$. Colors of the first color filter film 41, the second color filter film 42 and the third color filter film 43 are different from each other.

Some embodiments of the present disclosure do not limit the colors of the first color filter film 41, the second color filter film 42, and the third color filter film 43. Colors of the three color filter films may arbitrarily correspond to three primary colors red, green, and blue, as long as the colors of the three color filter films are different from each other. That is, the colors of the first color filter 41, the second color filter 42, and the third color filter 43 are red, green, and blue respectively, or are green, red, and blue respectively, or are blue, green, and red respectively, or are green, blue, and red respectively, or are red, blue, and green respectively, or are blue, red, and green respectively.

For example, the first color filter film 41 is a red filter film, the second color filter film 42 is a green filter film, and the third color filter film 43 is a blue filter film.

In some embodiments, a material of the first filter block 31 is the same as a material of any one of the first color filter film 41, the second color filter film 42, and the third color filter film 43; a material of the second filter block 32 is the same as a material of any one of the first color filter film 41, the second color filter film 42, and the third color filter film 43, and the material of the second filter block 32 is different from the material of the first filter block 31. In this way, each first filter block 31 may be formed with a filter film that is made of the same material as the first filter block 31 through a same patterning process, which simplifies a manufacturing process of the display panel 100. Similarly, each second filter block 32 may be formed with a filter film that is made of the same material as the second filter block 32, thereby further simplifying the manufacturing process of the display panel 100.

For example, a color sub-pixel region adjacent to each white sub-pixel region W is a third color sub-pixel region $P_3$, and a material of each first filter block 31 is the same as a material of the adjacent third color filter film 43. Based on this, each first filter block 31 is connected to the adjacent third color filter film 43. For example, a portion of each third color filter film 43 configured to be connected to the adjacent first filter block 31 covers a portion of one signal line 20 proximate to the third color sub-pixel region $P_3$ in two corresponding signal lines 20; or a portion of the first filter block 31 configured to be connected to the adjacent third color filter film covers a portion of one signal line 20 proximate to the third color sub-pixel region $P_3$ in two corresponding signal lines 20. In this way, each first filter block 31 and the adjacent third color filter film 43 may be formed through a same patterning process, and a complexity of patterning design may also be reduced in a process of patterning formation of each first filter block 31 and each third color filter film 43. Thereby, the design and manufacture of a corresponding mask plate and the manufacture of the display panel are simplified, which is conducive to improving the production efficiency of the display panel.

In addition, as shown in FIG. 2 or 4, a portion of each second filter block 32 further covers a portion of one signal line 20 proximate to the white sub-pixel region W in two corresponding signal lines 20, so as to reduce accuracy and difficulty of exposure required in a process of forming each second filter block 32 through photolithography. For example, a critical dimension (CD) deviation of the illuminance during exposure may be reduced.

In some examples, based on a fact that the material of the first filter block 31 is the same as the material of the adjacent third color filter film 43, and the material of the second filter block 32 is the same as the material of the first color filter film 41 or the second color filter film 42, each second filter block 32 may be formed with the first color filter film 41 or the second color filter film 42 that has a same color as the second filter block 32 in a same patterning process, thereby further simplifying a manufacturing process of each filter group 3.

Some embodiments of the present disclosure do not limit numbers and arrangements of the plurality of pixel regions 10a and the plurality of the sub-pixel regions in each pixel region 10a. For example, referring to FIGS. 1 and 3, in a row direction or a column direction in which the plurality of pixel regions 10a are arranged, the plurality of sub-pixel regions in each pixel region 10a are arranged in an order of the first color sub-pixel region $P_1$, the second color sub-pixel region $P_2$, the white sub-pixel region W, and the third color sub-pixel region $P_3$.

Figure 3:
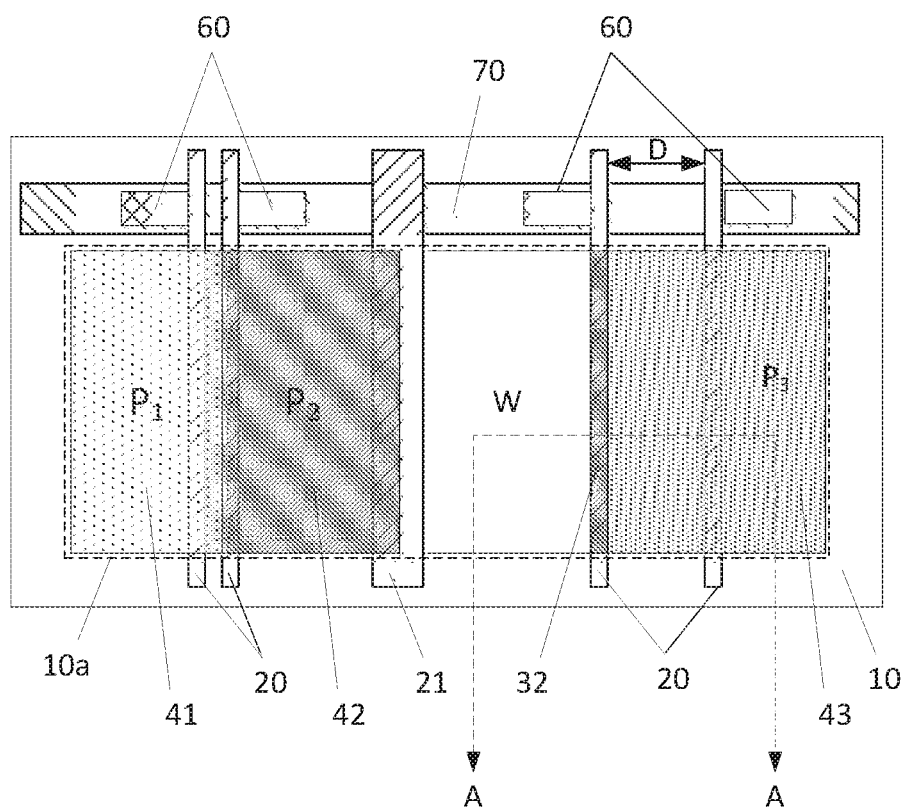
FIG. 3 is a schematic structural diagram of another display panel, according to some embodiments of the present disclosure.

Based on this, in each pixel region 10a, in a case where another two signal lines 20 are disposed between the first color sub-pixel region $P_1$ and the second color sub-pixel region $P_2$ (as shown in FIGS. 1 and 3), and there is a space between the two signal lines 20, one filter group 3 as described in the above embodiments is correspondingly disposed at the space between the two signal lines 20, that is, a structure, an arrangement and technical effects of the filter group 3 can be referred to the above embodiments, which will not be described in detail again.

Of course, it is also permissible to adopt other light shielding methods without providing the filter group 3 at the space between the two signal lines 20 between each first color sub-pixel region $P_1$ and an adjacent second color sub-pixel region $P_2$. For example, the first color filter film 41 in each first color sub-pixel region $P_1$ covers a portion of one signal line 20 proximate to the first color filter film 41 and extends to the other signal line 20; and the second color filter film 42 in the adjacent second color sub-pixel region $P_2$ covers a portion of one signal line 20 proximate to the second color filter film 42 and extends to the other signal line 20. In this way, the first color filter film 41 and the second color filter film 42 in each pixel region 10a generate an overlapping portion 30 between two corresponding signal lines 20, so as to avoid light mixing between the first color filter film 41 and the adjacent second color filter film 42. Herein, an order in which the first color filter film 41 and the second color filter film 42 generate the overlapping portion 30 between the two signal lines 20 is not limited. In FIG. 1, only an example where the first color filter film 41 is overlapped on the second color filter film 42 is illustrated.

In addition, as shown in FIGS. 1 and 3, the display panel 100 further includes a common power line 21 partially disposed between each second color sub-pixel region $P_2$ and the white sub-pixel region W. A width of the common power line 21 is generally greater than a width of the signal line 20, and the common power line 21 is made of an opaque metal material, which is capable of preventing light leakage between each second color sub-pixel region $P_2$ and the adjacent white sub-pixel region W. For example, each second color filter film 42 covers a portion of a surface of a corresponding common power line 21 away from the substrate 10, so as to reduce accuracy and difficulty of exposure required in a process of forming each second filter film 42 through photolithography, which is conducive to simplifying the manufacturing process of the display panel 100.

With continued reference to FIGS. 1 and 2, in a case where each pixel region 10a includes a first color sub-pixel region P1, a second color sub-pixel region P2, a white sub-pixel region W, and a third color sub-pixel region P3, a portion of the transparent insulating layer 50 disposed in each first color sub-pixel region P1 covers the corresponding first color filter film 41, a portion of the transparent insulating layer 50 disposed in each second color sub-pixel region P2 covers the corresponding second color filter film 42, a portion of the transparent insulating layer 50 disposed in each third color sub-pixel region P3 covers the corresponding third color filter film 43, and a portion of the transparent insulating layer 50 disposed in each white sub-pixel region W is directly formed on the substrate 10. No filter film is required to be disposed in each white sub-pixel region W. In some embodiments of the present disclosure, a portion of the transparent insulating layer 50 disposed in each white sub-pixel region W is used as a transparent color resistor, which may ensure that the white light emitted by the white organic light-emitting diode 8 in each white sub-pixel region W is still white light after being emitted through the transparent insulating layer 50, and may meet display requirements of each white sub-pixel region W.

In the description of the above embodiments, specific features, structures, materials or characteristics may be combined in an appropriate manner in any one or more embodiments or examples.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, having a plurality of pixel regions arranged in an array, each pixel region including a plurality of sub-pixel regions, one of the plurality of sub-pixel regions being a white sub-pixel region, and remaining sub-pixel regions being color sub-pixel regions; wherein in each pixel region, the remaining sub-pixel regions include a first color sub-pixel region, a second color sub-pixel region, and a third color sub-pixel region; and the display panel comprising:
a plurality of signal lines, wherein the plurality of signal lines include two signal lines that are adjacent to each other, a portion of each of the two signal lines is disposed between one white sub-pixel region and an adjacent color sub-pixel region, and there is a space between the two signal lines;
at least one filter group, wherein each filter group includes a first filter block and a second filter block that are disposed in a stack, and a light transmission wavelength range of the first filter block does not overlap with a light transmission wavelength range of the second filter block;
a plurality of color filter films, including:
a plurality of first color filter films, at least one portion of each first color filter film being disposed in a corresponding first color sub-pixel region;
a plurality of second color filter films, at least one portion of each second color filter film being disposed in a corresponding second color sub-pixel region; and
a plurality of third color filter films, at least one portion of each third color filter film being disposed in a corresponding third color sub-pixel region;
a substrate, wherein the plurality of signal lines and the at least one filter group are disposed on the substrate, and the second filter block in each filter group is disposed on a side of the first filter block in a same filter group away from the substrate; and
a transparent insulating layer at least covering each white sub-pixel region, each second filter block, each first color filter film, each second color filter film and each third color filter film, the transparent insulating layer being a one-piece whole layer, and an orthographic projection of the transparent insulating layer on the substrate completely covering an orthographic projection of the filter group on the substrate, wherein
an overlapping portion of the first filter block and the second filter block that are in one filter group covers a portion of the space disposed between the white sub-pixel region and the adjacent color sub-pixel region, and colors of each first color filter film, each second color filter film, and each third color filter film are different from each other.

2. The display panel according to claim 1, wherein in the filter group, a material of one of the first filter block and the second filter block is the same as a material of an adjacent color filter film.

3. The display panel according to claim 2, wherein a material of the first filter block in the filter group is the same as a material of the adjacent color filter film, and the first filter block is connected to the adjacent color filter film; and the color filter film includes a portion connected to the first filter block, and the portion covers a portion of one signal line proximate to the color filter film in the two signal lines; or the first filter block includes a portion connected to the color filter film, and the portion covers a portion of one signal line proximate to the color filter film in the two signal lines.

4. The display panel according to claim 3, wherein the first filter block and the adjacent color filter film are connected to each other so as to form a whole structure.

5. The display panel according to claim 1, wherein a material of the first filter block is the same as a material of any one of each first color filter film, each second color filter film, and each third color filter film; and a material of the second filter block is the same as a material of any one of each first color filter film, each second color filter film, and each third color filter film, and the material of the second filter block is different from the material of the first filter block in a same filter group.

6. The display panel according to claim 5, wherein a color sub-pixel region adjacent to each white sub-pixel region is a third color sub-pixel region; and a material of the first filter block in the filter group is the same as a material of an adjacent third color filter film.

7. The display panel according to claim 6, wherein the first filter block is connected to the adjacent third color filter film, wherein the third color filter film includes a portion connected to the first filter block, and the portion covers a portion of one signal line proximate to the third color sub-pixel region in the two signal lines; or the first filter block includes a portion connected to the third color filter film, and the portion covers a portion of one signal line proximate to the third color sub-pixel region in the two signal lines.

8. The display panel according to claim 7, wherein the first filter block and the adjacent third color filter film are connected to each other so as to form a whole structure.

9. The display panel according to claim 1, wherein a portion of the second filter block in the filter group covers a portion of one signal line proximate to the white sub-pixel region in the two signal lines.

10. The display panel according to claim 1, further comprising:

a plurality of white organic light-emitting diodes disposed on a side of the transparent insulating layer away from the substrate, wherein each white organic light-emitting diode is disposed in a corresponding sub-pixel region, a light emission direction of each white organic light-emitting diode is directed toward the substrate, and light-emitting layers of two adjacent white organic light-emitting diodes are connected.

11. The display panel according to claim 10, further comprising a driving transistor electrically connected to each white organic light-emitting diode.

12. The display panel according to claim 1, wherein in a row direction or a column direction in which the plurality of pixel regions are arranged, sub-pixel regions in each pixel region are arranged in an order of the first color sub-pixel region, the second color sub-pixel region, the white sub-pixel region, and the third color sub-pixel region.

13. The display panel according to claim 1, wherein the first color filter film includes a red filter film, the second color filter film includes a green filter film, and the third color filter film includes a blue filter film.

14. The display panel according to claim 1, wherein the plurality of signal lines include a plurality of data lines.

15. The display panel according to claim 1, wherein the plurality of signal lines include a plurality of gate lines.

16. The display panel according to claim 1, further comprising a common power line partially disposed between the white sub-pixel region and another adjacent color sub-pixel region.

17. The display panel according to claim 1, wherein a color sub-pixel region adjacent to each white sub-pixel region is a third color sub-pixel region; and the plurality of signal lines further include another two signal lines that are adjacent to each other, a portion of each of the two signal lines is disposed between one first color sub-pixel region and an adjacent second color sub-pixel region, and there is a space between the two signal lines; wherein one first color filter film disposed in the first color sub-pixel region covers a portion of one signal line proximate to the first color sub-pixel region in the two signal lines, and extends to the other signal line in the two signal lines; and one second color filter film disposed in the second color sub-pixel region covers a portion of one signal line proximate to the second color sub-pixel region in the two signal lines, and extends to the other signal line in the two signal lines.

\* \* \* \* \*